(12) United States Patent
Lee et al.

(10) Patent No.: US 8,587,194 B2
(45) Date of Patent: Nov. 19, 2013

(54) TOP EMISSION TYPE ORGANIC ELECTROLUMINESCENT DISPLAY DEVICE AND METHOD OF FABRICATING THE SAME

(75) Inventors: Jae-Yoon Lee, Seoul (KR); Sung-Joon Bae, Guri-si (KR)

(73) Assignee: LG Display Co., Ltd., Seoul (KR)

( * ) Notice: Subject to any disclaimer, the term of this patent is extended or adjusted under 35 U.S.C. 154(b) by 1066 days.

(21) Appl. No.: 12/581,820

(22) Filed: Oct. 19, 2009

(65) Prior Publication Data

US 2010/0315318 A1 Dec. 16, 2010

(30) Foreign Application Priority Data

Jun. 16, 2009 (KR) ........................ 10-2009-0053630

(51) Int. Cl.
*H01J 1/62* (2006.01)
*H01J 9/20* (2006.01)
*H05B 33/00* (2006.01)

(52) U.S. Cl.
USPC ............. 313/505; 313/504; 313/506; 345/30; 345/36; 345/44; 257/59

(58) Field of Classification Search
USPC ................................................. 313/504, 506
See application file for complete search history.

(56) References Cited

U.S. PATENT DOCUMENTS

| | | | | |
|---|---|---|---|---|
| 2003/0132927 A1* | 7/2003 | Ouchi et al. | .................. | 345/204 |
| 2008/0157082 A1* | 7/2008 | Yang et al. | ...................... | 257/59 |
| 2008/0157083 A1* | 7/2008 | Park et al. | ........................ | 257/59 |
| 2008/0180024 A1* | 7/2008 | Kwon | ........................... | 313/504 |
| 2008/0277666 A1* | 11/2008 | Jeon et al. | ....................... | 257/66 |

\* cited by examiner

*Primary Examiner* — Sikha Roy
(74) *Attorney, Agent, or Firm* — Birch, Stewart, Kolasch & Birch, LLP

(57) ABSTRACT

An organic electroluminescent display (OELD) device includes a first substrate having a first unit pixel region including first and second pixel regions; first and second gate lines along a first direction; first and second data lines along a second direction; a switching TFT in the first pixel region; a driving TFT in the first pixel region; a passivation layer including a first contact hole exposing a portion of the driving TFT; a first electrode contacting the driving TFT through the first contact hole; a bank surrounding the second pixel region an organic emitting layer in the second pixel region; and a transparent second electrode on the organic emitting layer and the bank, wherein the second pixel region is a region shifted from the first pixel region such that the second gate line goes across the second pixel region.

13 Claims, 8 Drawing Sheets

TOP EMISSION TYPE ORGANIC ELECTROLUMINESCENT DISPLAY DEVICE AND METHOD OF FABRICATING THE SAME

The present application claims the benefit of Korean Patent Application No. 10-2009-0053630 filed in Korea on Jun. 16, 2009, which is hereby incorporated by reference for all purposes as if fully set forth herein.

BACKGROUND OF THE INVENTION

1. Field of the Invention

The present invention relates to an organic electroluminescent display (OELD) device, and more particularly, to a top emission type OELD device including an organic emitting layer having an increasing area and improved luminance and a method of fabricating the same.

2. Discussion of the Related Art

The OELD device as a flat panel display device has excellent characteristics, such as high luminance, lower power consumption, and so on. In addition, since the OELD device is a self-emission type, the OELD device has high contrast ratio, a thin profile, a wide viewing angle and fast response time. Moreover, due to their simple fabricating process, the fabrication costs of OELD devices are low as compared with LCD devices.

The OELD devices are divided into a passive matrix type and an active matrix type according to the driving method thereof. The passive matrix type OELD devices have a simple structure and a simple fabricating process. However, the passive matrix type OELD devices have disadvantages of high power consumption and low quality images. Moreover, the more lines are disposed, the less the passive matrix type OELD device has aperture ratio. On the other hand, the active matrix type OELD devices have advantages of high emission efficiency and high quality images.

In the active matrix type OELD device, a thin film transistor for turning on and off a pixel is disposed in each pixel. A first electrode, which is connected to the thin film transistor, is turned on and off, and a second electrode facing the first electrode functions as a common electrode. A voltage applied to the pixel is charged in a storage capacitor. The voltage is applied to the first electrode during corresponding frame due to the storage capacitor. The OELD device can operate in each frame irrespective of a number of scanning lines. As a result, the active matrix type OELD device has advantages, for example, in power consumption, such that the active matrix type OELD device is widely used.

Figure 1:
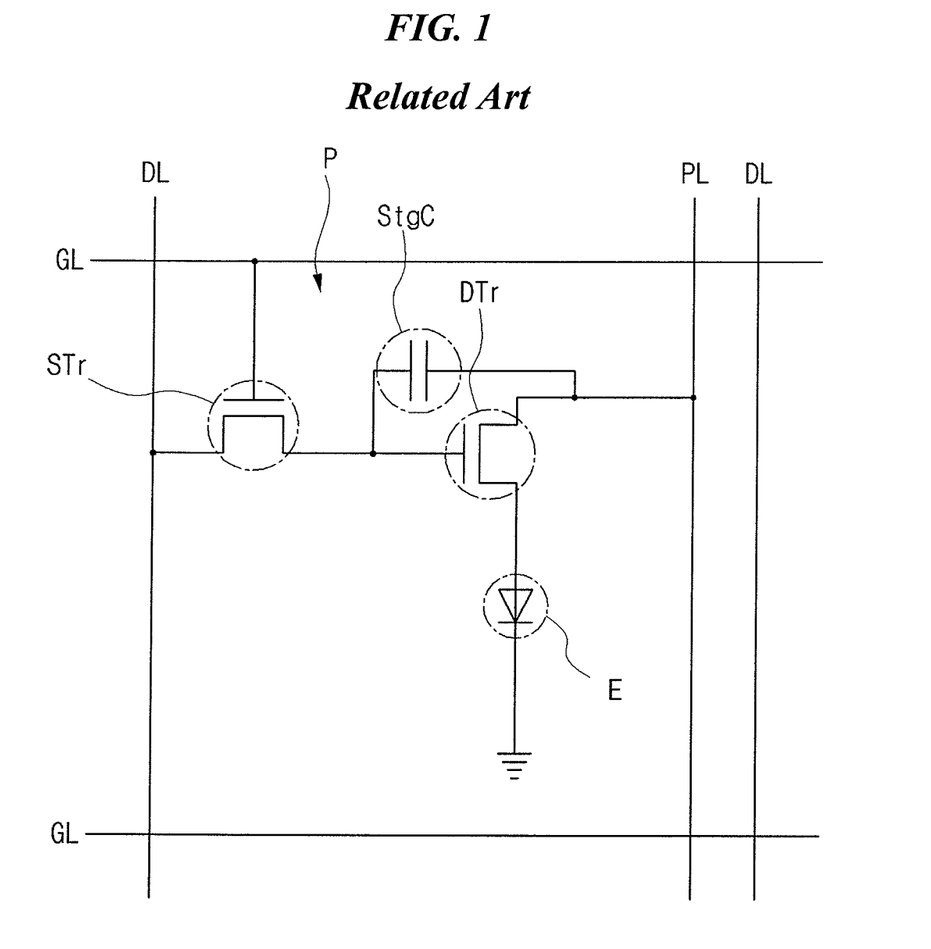
FIG. 1 is a circuit diagram of the related art active matrix type OELD device.

FIG. 1 is a circuit diagram of the related art active matrix type OELD device. In FIG. 1, a gate line GL, a data line DL, a power line PL, a switching thin film transistor (TFT) STr, a driving TFT DTr, a storage capacitor (StgC) and an organic electroluminescent diode E are formed in each pixel region P of the active matrix type OELD device. The gate and data lines GL and DL cross each other to define the pixel region P, and the power line PL for applying a power voltage is parallel to the data line DL.

The switching TFT STr is disposed at a crossing portion of the gate and data lines GL and DL, and the driving TFT DTr is connected to the switching TFT STr. A first electrode of the organic electroluminescent diode E is connected to the driving TFT DTr, and a second electrode of the organic electroluminescent diode E is connected to the power line PL. The storage capacitor StgC is positioned between a gate electrode of the driving TFT DTr and a source electrode of the driving TFT DTr. When the switching TFT STr is turned on by a signal through the gate line GL, a single from the data line DL is applied to the gate electrode of the driving TFT DTr through the switching TFT STr such that the driving TFT DTr is turned on. As a result, the organic electroluminescent diode E emits light. When the driving TFT DTr is turned on, a voltage level applied into the organic electroluminescent diode E is determined such that the organic electroluminescent diode E can produce a predetermined gray scale. Even if the switching TFT STr is turned off, a voltage level applied into the organic electroluminescent diode E is maintained due to the storage capacitor StgC.

The OELD device is classified into a tope emission type and a bottom emission type. The bottom emission type OELD device has problems, for example, low aperture ratio. Accordingly, the top emission type OELD device is widely used.

Figure 2:
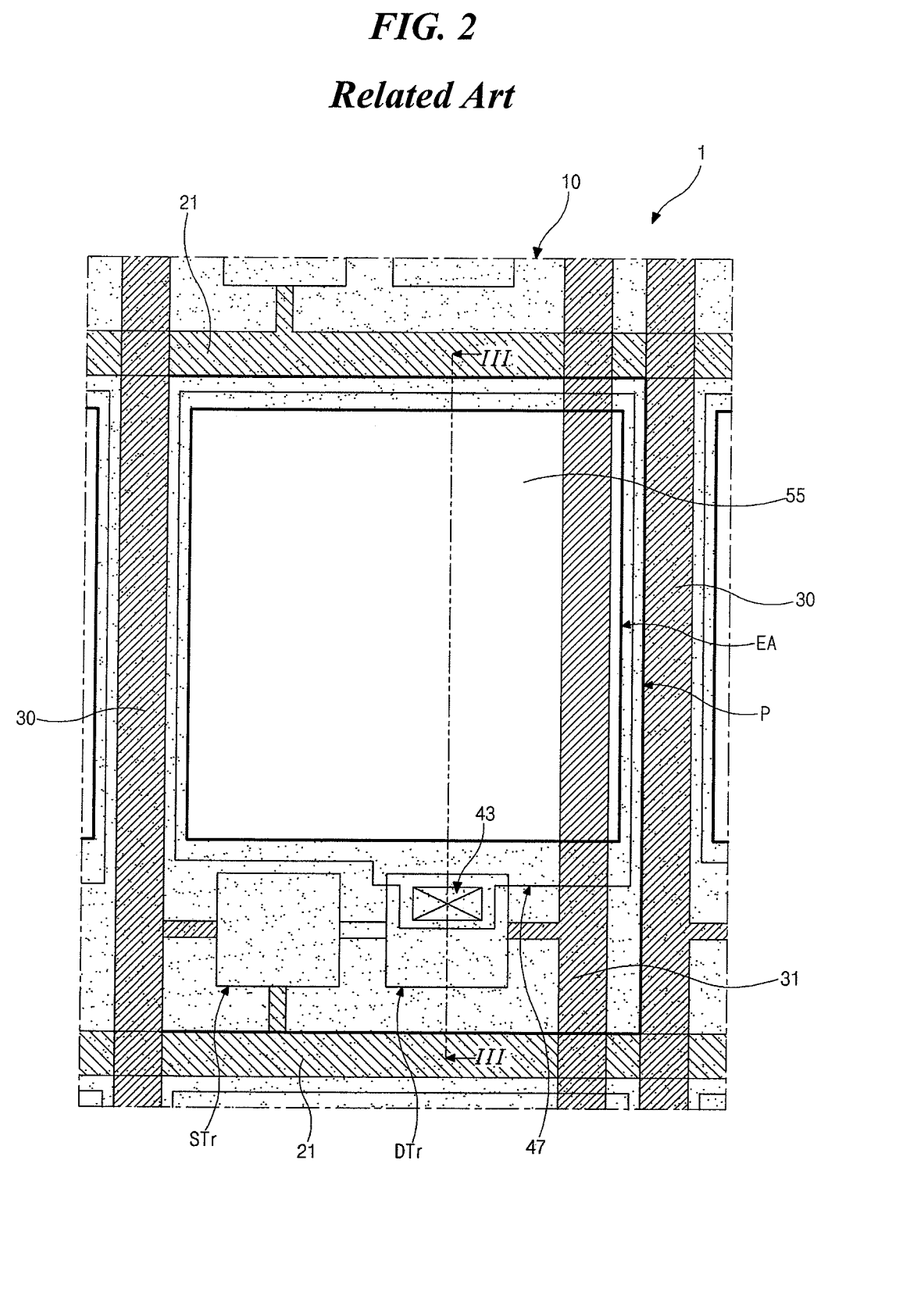
FIG. 2 is a schematic plan view of one pixel region in the related art top emission type OELD device.
Figure 3:
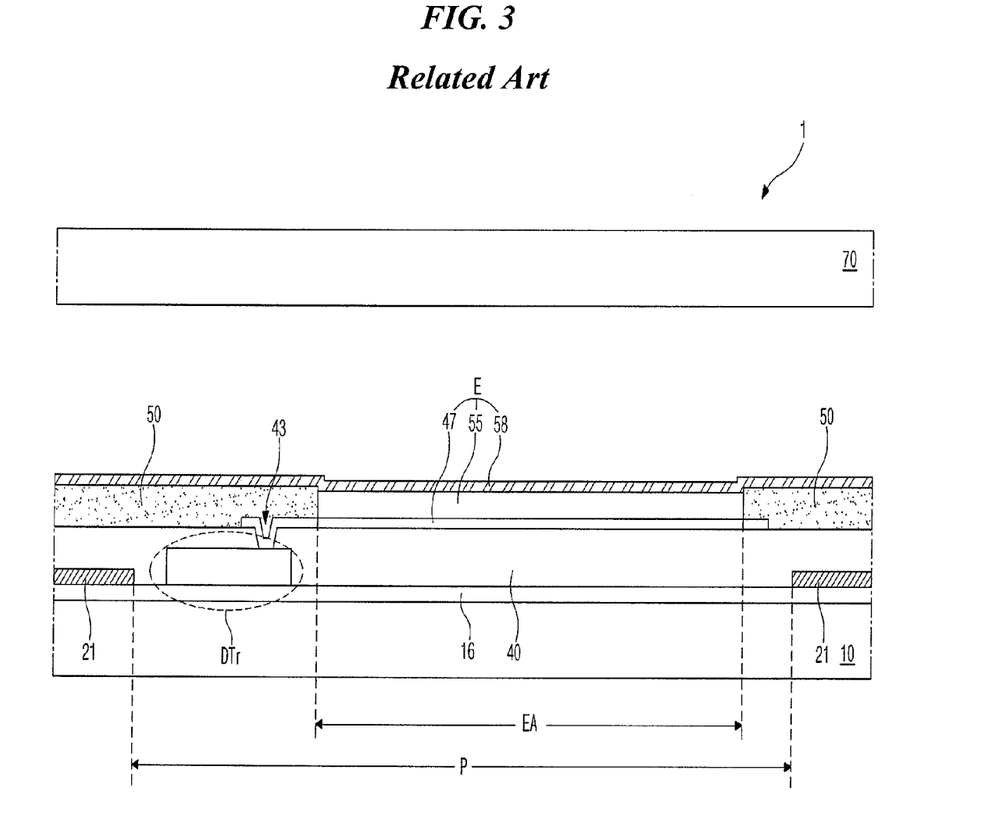
FIG. 3 is a cross-sectional view taken along the line III-III of FIG. 2.

FIG. 2 is a schematic plan view of one pixel region in the related art top emission type OELD device, and FIG. 3 is a cross-sectional view taken along the line III-III of FIG. 2. For convenience of explanation, each of a switching TFT and a driving TFT is shown as a rectangular box. In FIGS. 2 and 3, the OELD device 1 includes first and second substrates 10 and 70, and a seal pattern (not shown) sealing a spaced between the first and second substrates 10 and 70.

On the first substrate, a gate line 21, a data line 30, a power line 31, a switching TFT STr, a driving TFT DTr, a passivation layer 40, an organic emitting diode E and a bank 50 are formed. The gate and data lines 21 and 30 cross each other to define a pixel region P, and the power line 31 is parallel to the data line 30. The switching TFT STr is connected to the gate and data lines 21 and 30. The driving TFT DTr is connected to the switching TFT and the power line 31, and the passivation layer 40 including a drain contact hole 43, which exposes a portion of the driving TFT DTr, is formed on the driving TFT DTr. The organic electroluminescent diode E includes first and second electrodes 47 and 58, and an organic emitting layer 55 therebetween. The first electrode 47 is connected to the driving TFT DTr through the drain contact hole 43. The organic emitting layer 55 includes emitting material patterns of red, green and blue colors. The bank 50 is positioned at boundaries of the pixel region P and has an opening corresponding to an emitting area EA. The organic emitting layer 55 is positioned in the emitting area EA. The second electrode 58 is formed on the organic emitting layer 55 and covers an entire surface of the first substrate 10. The first and second electrodes 47 and 58 respectively provide an electron and a hole into the organic emitting layer 55. The second substrate 70 is spaced apart from the second electrode 58 on the first substrate 10 by the seal pattern.

As mentioned above, the bank 50 is formed at boundaries of the pixel region P and surrounds the emitting area EA. In addition, the bank 50 covers a portion of the first electrode 47 to cover the drain contact hole 43. When the first electrode 47 contacts the driving TFT DTr through the drain contact hole 43, the first electrode 47 has an uneven surface such as a "V" shape. If the organic emitting layer 55 is formed on an uneven surface of the first electrode 47, there is a concentration problem of a current or an electric field such that a thermal degradation is generated and lifetime is reduced. To prevent theses problems, the bank 50 covers the uneven surface of the first electrode 47 corresponding to the drain contact hole 43.

In the above OELD device 1, a size of the emitting area EA depends on a position of the drain contact hole 43. Namely, aperture ratio of the OELD device 1 is determined by a portion of the drain contact hole 43. When the drain contact hole 43 is positioned at an uppermost portion or at lowest portion of a pixel region P, the aperture ration of the OELD device 1 can be maximized. Unfortunately, it is almost impossible to position the drain contact hole 43 at an uppermost portion or at lowest portion of a pixel region P. Consequently, there is a limitation for maximizing the aperture ratio of the OELD device 1.

SUMMARY OF THE INVENTION

Accordingly, the present invention is directed to an organic electroluminescent display (OELD) device and a method of fabricating the same that substantially obviate one or more of the problems due to limitations and disadvantages of the related art.

An object of the present invention is to provide an OELD device having increasing aperture ratio.

Another object of the present invention is to provide an OELD device having increasing luminance.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display (OELD) device includes a first substrate having a first unit pixel region including a first pixel region and a second pixel region; first and second gate lines along a first direction and on the first substrate; first and second data lines along a second direction, which is perpendicular to the first direction, and crossing the first and second gate lines to define the first pixel region; a power line parallel to one of the first and second directions; a switching thin film transistor (TFT) in the first pixel region and connected to the first gate line and the first data line; a driving TFT in the first pixel region and connected to the switching TFT and the power line; a passivation layer on the switching and driving TFTs and including a first contact hole exposing a portion of the driving TFT; a first electrode in a portion of the first pixel region and an entire surface of the second pixel region, and contacting the driving TFT through the first contact hole; a bank surrounding the second pixel region and corresponding the first contact hole; an organic emitting layer in the second pixel region and on the first electrode; and a transparent second electrode on the organic emitting layer and the bank, wherein the second pixel region is a region shifted from the first pixel region such that the second gate line goes across the second pixel region.

In another aspect of the present invention, a method of fabricating an OELD device includes forming first and second gate lines along a first direction and on a first substrate having an unit pixel region, the unit pixel region including a first pixel region and a second pixel region; forming first and second data lines along a second direction, which is perpendicular to the first direction, and crossing the first and second gate lines to define the first pixel region; forming a power line; forming a switching thin film transistor (TFT) in the first pixel region and connected to the first gate line and the first data line; forming a driving TFT in the first pixel region and connected to the switching TFT and the power line; forming a passivation layer on the switching and driving TFTs and including a first contact hole exposing a portion of the driving TFT; forming a first electrode in a portion of the first pixel region and an entire surface of the second pixel region, and contacting the driving TFT through the first contact hole; forming a bank surrounding the second pixel region and corresponding the first contact hole; forming an organic emitting layer in the second pixel region and on the first electrode; and forming a transparent second electrode on the organic emitting layer and the bank, wherein the second pixel region is a region shifted from the first pixel region such that the second gate line goes across the second pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 4:
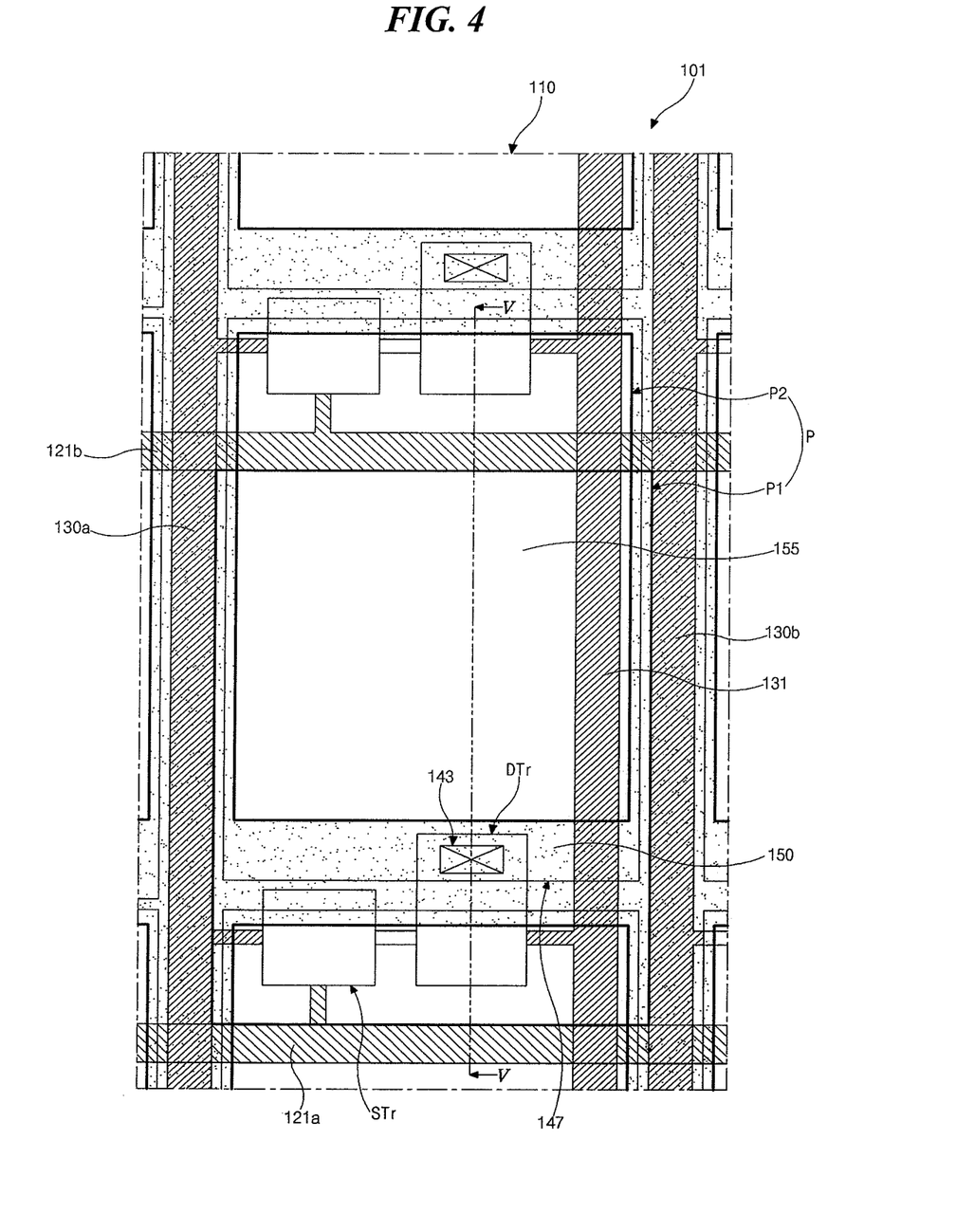
FIG. 4 is a schematic plan view of an OELD device according to a first embodiment of the present invention.
Figure 5:
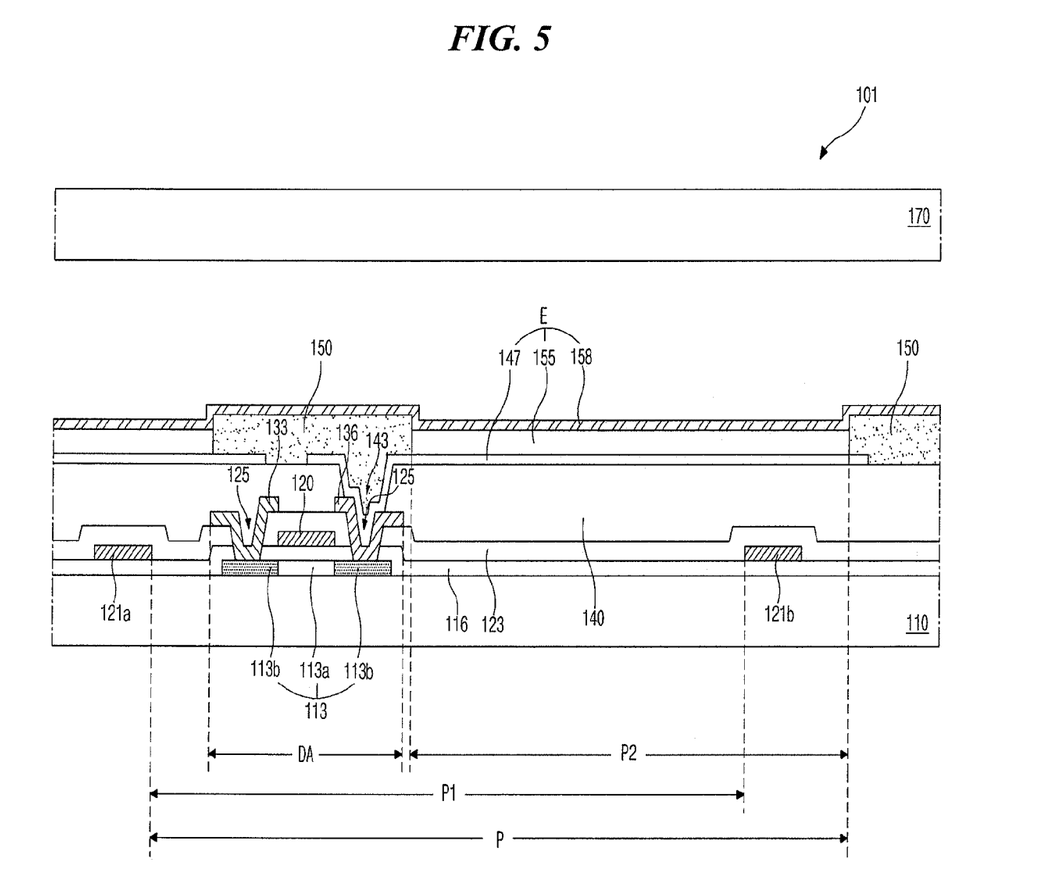
FIG. 5 is a cross-sectional view taken along the line V-V of FIG. 4.

FIG. 4 is a schematic plan view of an OELD device according to a first embodiment of the present invention, and FIG. 5 is a cross-sectional view taken along the line V-V of FIG. 4. A first pixel region is defined as a region surrounded by gate and data lines, and a second pixel region is defined as a region surrounded by a bank. An unit pixel includes the first and second pixel regions. In FIG. 4, each of a switching TFT and a driving TFT is shown as a rectangular box. A region, where the driving TFT is formed, is defined as a driving area DA, and a region, where the switching TFT is formed, is defined as a switching area.

Referring to FIGS. 4 and 5, an OELD device 101 includes a first substrate 110, where a switching TFT STr, a driving TFT DTr, and an organic electroluminescent diode E are formed, and a second substrate 170 for encapsulating the organic electroluminescent diode E.

Referring to FIG. 4, first and second gate lines 121a and 121b, first and second data lines 130a and 130b, and a power line 131 are formed on the first substrate 110. The power line 131 is parallel to the first and second data lines 130a and 130b and positioned between the first and second data lines 130a and 130b. Alternatively, the power line may be parallel to the first and second gate lines 121a and 121b and positioned between the first and second gate lines 121a and 121b. The first and second gate lines 121a and 121b cross the first and second data lines 130a and 130b to define a first pixel region P1. Namely, the first pixel region P1 is surrounded by the first and second gate lines 121a and 121b, and the first and second data lines 130a and 130b. A bank 150 having an opening is formed on the first substrate 110. The opening is defined as a second pixel region P2. Namely, the second pixel region P2 is surrounded by the bank 150. The first and second pixel regions P1 and P2 are defined as an unit pixel P. The second pixel region P2 partially overlaps the first pixel region P1 and an upper first pixel region P1. A vertical portion of the bank 150 corresponds to the data lines 130a and 130b, and a horizontal portion of the bank 150 goes across the first pixel region P1. In other word, the second gate line 121b goes across the second pixel region P2 having a relation to the first gate line 121a.

A switching TFT STr and a driving TFT DTr is positioned in the first pixel region P1. The switching TFT STr is formed at a crossing portion of the first gate and data lines 121a and 130a. The switching TFT STr is connected to the first gate and data lines 121a and 130a. A driving TFT DTr is connected to the switching TFT STr and the power line 131. FIG. 4 shows one driving TFT DTr. Alternatively, several driving TFTs DTr, for example, one to eleven driving TFTs, may be further formed depending on requirements. For example, the driving TFTs may be used for a compensation circuit for preventing a thermal degradation of an organic emitting layer and improving an image quality.

A first electrode 147 is formed in a portion of the first pixel region P1 and an entire surface of the second pixel region P2. The first electrode 147 is connected to the driving TFT DTr through a drain contact hole 143. The bank 150 corresponds to the drain contact hole 143 such that the drain contact hole 143 is positioned in the first pixel region P1, not the second pixel region P2. Since the second gate line 121b goes across the second pixel region P2, the first electrode 147 overlaps the second gate line 121b. FIG. 4 shows the first electrode 147 does not overlap the data lines 130a and 130b. However, the first electrode 147 may overlap a portion of the first data line 130a and a portion of the second data line 130b. The first electrode 147 has an island shape to be isolated from a first electrode in other unit pixels. On the first electrode 147, an organic emitting layer 155 for emitting one of red, green and blue colors is formed in the second pixel region P2 except the first pixel region P1. Another organic emitting layer 155 emits another one of red, green and blue colors, and another organic emitting layer 155 emits the other one of red, green and blue colors. The organic emitting layer 155 covers an entire surface of the second pixel region P2 except for the first pixel region P1. The organic emitting layer 155 overlaps the second gate line 121b. FIG. 4 shows the organic emitting layer 155 does not overlap the data lines 130a and 130b. However, the organic emitting layer 155 may overlap a portion of the first data line 130a and a portion of the second data line 130b. The organic emitting layer 155 has an island shape due to the bank 150. A second electrode (not shown) is formed on the organic emitting layer 155. The second electrode covers an entire surface of a display region of the first substrate 110. The first electrode 147, the organic emitting layer 155 and the second electrode constitute an organic electroluminescent diode.

The unit pixel P is divided into the first pixel region P1, which is surrounded the gate lines 121a and 121b and the data lines 130a and 130b, and the second pixel region P2, which is surrounded by the bank 150, such that an aperture ratio is increased. Namely, a portion between the second gate line 121b and the driving contact hole 143 for the driving TFT DTr, which has a relation to the second gate line 121b, is used as the second pixel region P2. Accordingly, an area for the organic emitting layer 155 is maximized irrespective of a position of the drain contact hole 143 (or the driving TFT DTr). Having the relation means one element is electrically connected to another element.

In FIG. 4, since one driving TFT DTr in the first pixel region P1 is adjacent to the first gate line 121a, the second pixel region P2 is shift along an upper direction of the data lines 130a and 130b with respect to the first pixel region P1.

Figure 6:
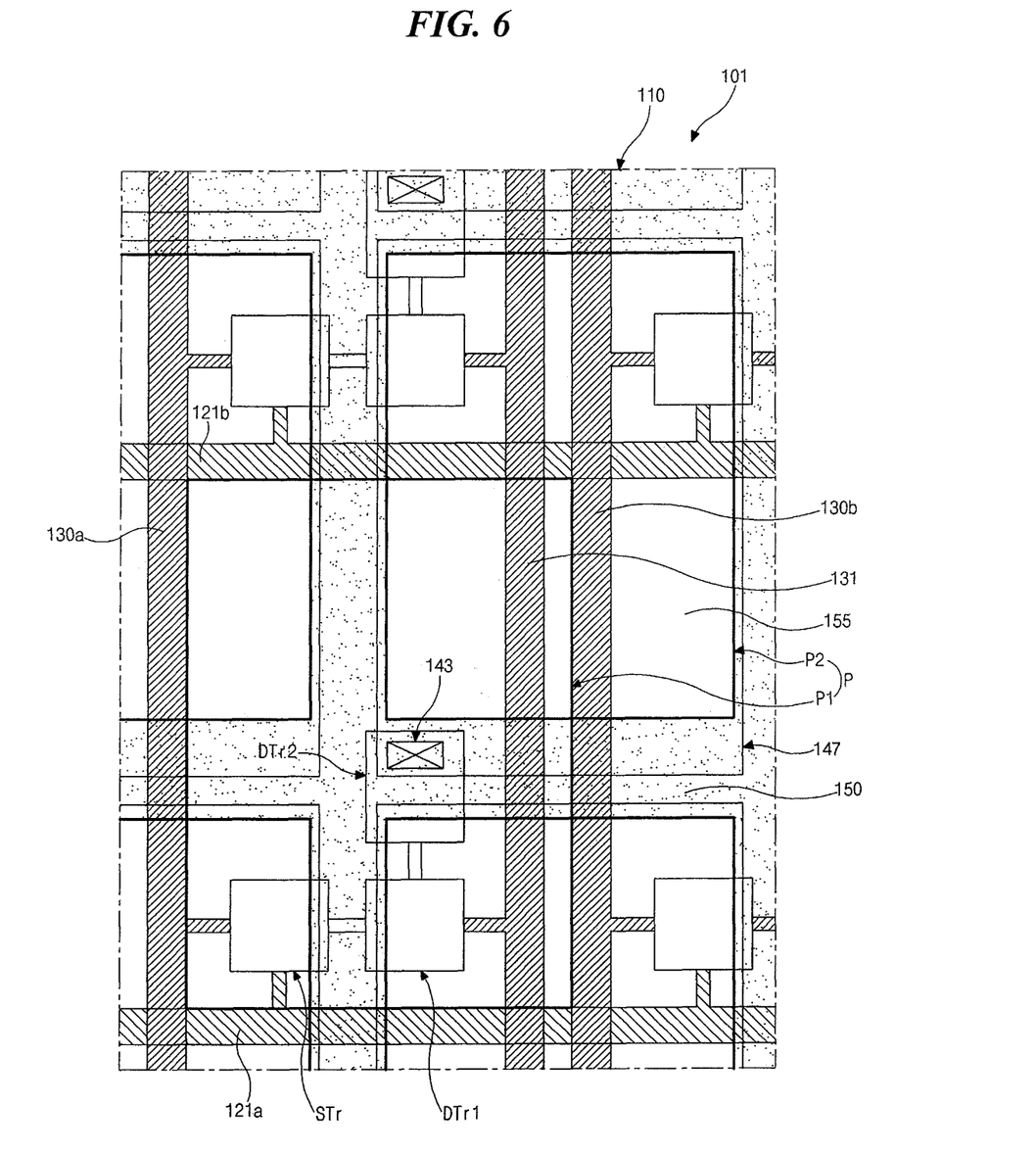
FIG. 6 is a schematic plan view of an OELD device according to a second embodiment of the present invention.

FIG. 6 is a schematic plan view of an OELD device according to a second embodiment of the present invention. In FIG. 6, first and second gate lines 121a and 121b, first and second data lines 130a and 130b, and a power line 131 are formed on the first substrate 110. The power line 131 is parallel to the first and second data lines 130a and 130b and positioned between the first and second data lines 130a and 130b. Alternatively, the power line may be parallel to the first and second gate lines 121a and 121b and positioned between the first and second gate lines 121a and 121b. The first and second gate lines 121a and 121b cross the first and second data lines 130a and 130b to define a first pixel region P1. Namely, the first pixel region P1 is surrounded by the first and second gate lines 121a and 121b, and the first and second data lines 130a and 130b. A bank 150 having an opening is formed on the first substrate 110. The opening is defined as a second pixel region P2. Namely, the second pixel region P2 is surrounded by the bank 150. The first and second pixel regions P1 and P2 are defined as an unit pixel P. The second pixel region P2 partially overlaps the first pixel region P1 and portions of second pixel regions of an upper side unit pixel, a right side unit pixel and a diagonal side unit pixel. A vertical portion of the bank 150 and a horizontal portion of the bank 150 go across the first pixel region P1. In other word, the second gate line 121b goes across the second pixel region P2 having a relation to the first gate line 121a. Alternatively, the vertical portion of the bank 150 may correspond to the data lines 130a and 130b.

Two driving TFTs DTr1 and DTr2 are formed in each first pixel region P1. The first driving TFT DTr1 is connected to a switching TFT STr, and the second driving TFT DTr2 is connected to the first driving TFT DTr1. The second driving TFT DTr2 is closer to the second gate line 121b than the first driving TFT DTr1 such that the second driving TFT DTr2 is positioned at a center of the first pixel region P1. A first electrode 147 is connected to a drain contact hole 143 exposing a portion of the second driving TFT DTr2. The first electrode 147 extends from the drain contact hole 143 into the second pixel region P2. The second pixel region P2 is shift along a diagonal direction with respect to the first pixel region P1. The second pixel region P2, which has a relation to the first gat line 121b and the first data line 130a, overlaps portions of second pixel regions of an upper side unit pixel, a right side unit pixel and a diagonal side unit pixel. The first electrode 147 and the organic emitting layer 155 overlap the second gate line 121b, the second data line 130b and the power line 131. In the second embodiment, even if the second driving TFT DTr2 is positioned at a center of the first pixel region P1, the second pixel region P2 has substantially the same area as the first pixel region P1 such that an area for an emitting layer 155 is maximized. Namely, since portions between the bank 150 and the second gate line 121b in the upper side unit pixel and the diagonal side unit pixel and between the bank 150 and the second data line 130b in the right side unit pixel are used for the area for the emitting layer 155, the area for the emitting layer 155 is maximized such that luminance is improved. In other word, an aperture ratio of the OELD device 101 is maximized.

Figure 7:
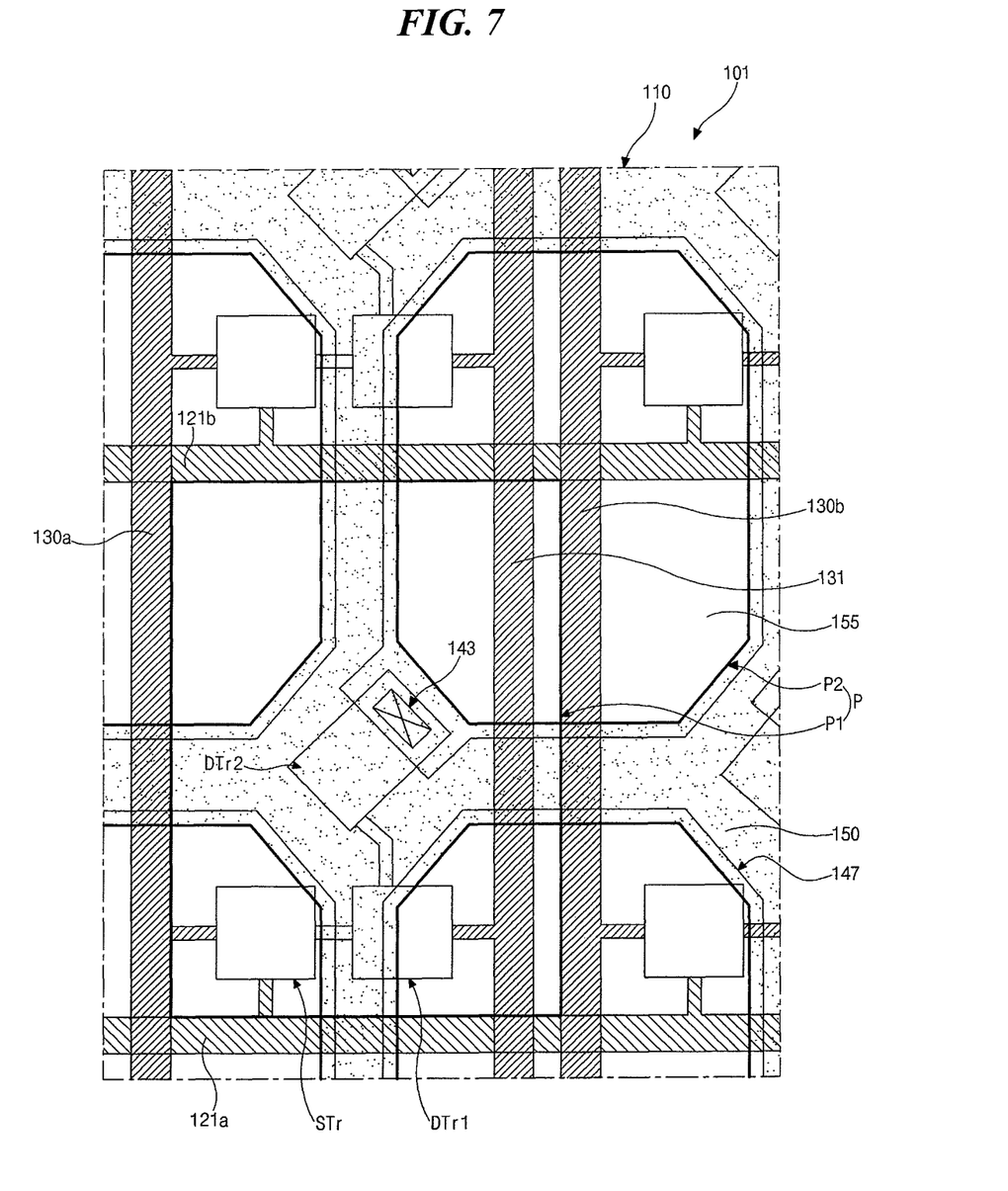
FIG. 7 is a schematic plan view of an OELD device according to a third embodiment of the present invention.

FIG. 7 is a schematic plan view of an OELD device according to a third embodiment of the present invention. In FIG. 7, first and second gate lines 121a and 121b, first and second data lines 130a and 130b, and a power line 131 are formed on the first substrate 110. The power line 131 is parallel to the first and second data lines 130a and 130b and positioned between the first and second data lines 130a and 130b. Alternatively, the power line may be parallel to the first and second gate lines 121a and 121b and positioned between the first and second gate lines 121a and 121b. The first and second gate lines 121a and 121b cross the first and second data lines 130a and 130b to define a first pixel region P1. Namely, the first pixel region P1 is surrounded by the first and second gate lines 121a and 121b, and the first and second data lines 130a and 130b. A bank 150 having an opening is formed on the first substrate 110. The opening is defined as a second pixel region P2. Namely, the second pixel region P2 is surrounded by the bank 150. The first and second pixel regions P1 and P2 are defined as an unit pixel P. The second pixel region P2 partially overlaps the first pixel region P1 and portions of second pixel regions of an upper side unit pixel, a right side unit pixel and a diagonal side unit pixel. A vertical portion of the bank 150 and a horizontal portion of the bank 150 go across the first pixel region P1. In other word, the second gate line 121b goes across the second pixel region P2 having a relation to the first gate line 121a. Alternatively, the vertical portion of the bank 150 may correspond to the data lines 130a and 130b.

Two driving TFTs DTr1 and DTr2 are formed in each first pixel region P1. The first driving TFT DTr1 is connected to a switching TFT STr, and the second driving TFT DTr2 is connected to the first driving TFT DTr1. The second driving TFT DTr2 is closer to the second gate line 121b than the first driving TFT DTr1 such that the second driving TFT DTr2 is positioned at a center of the first pixel region P1. A first electrode 147 is connected to a drain contact hole 143 exposing a portion of the second driving TFT DTr2. The first electrode 147 extends from the drain contact hole 143 into the second pixel region P2. The second pixel region P2 is shift along a diagonal direction with respect to the first pixel region P1. The second pixel region P2, which has a relation to the first gat line 121b and the first data line 130a, overlaps portions of second pixel regions of an upper side unit pixel, a right side unit pixel and a diagonal side unit pixel. The first electrode 147 and the organic emitting layer 155 overlap the second gate line 121b, the second data line 130b and the power line 131.

In FIGS. 4 and 6, each of the first and second pixel regions P1 and P2 has a rectangular shape. However, in FIG. 7, the first pixel region P1 has a rectangular shape, while the second pixel region P2 has a polygonal shape having at least five angles. For example, the second pixel region P2 may have a honey comb shape.

In the third embodiment, even if the second driving TFT DTr2 is positioned at a center of the first pixel region P1, the second pixel region P2 has substantially the same area as the first pixel region P1 such that an area for an emitting layer 155 is maximized. Namely, since portions between the bank 150 and the second gate line 121b in the upper side unit pixel and the diagonal side unit pixel and between the bank 150 and the second data line 130b in the right side unit pixel are used for the area for the emitting layer 155, the area for the emitting layer 155 is maximized such that luminance is improved. In other word, an aperture ratio of the OELD device 101 is maximized.

Referring to FIGS. 4 and 5, a cross-sectional structure of the OELD device is explained. In FIG. 5, a semiconductor layer 113 of polycrystalline silicon is formed on the first substrate 110 and in the driving region DA and the switching region (not shown). The semiconductor layer includes a first portion 113a of the semiconductor layer 113, which serves as a channel, and a second portion, where a high-concentration impurity is doped, at both sides of the first portion 113a.

Figure 8:
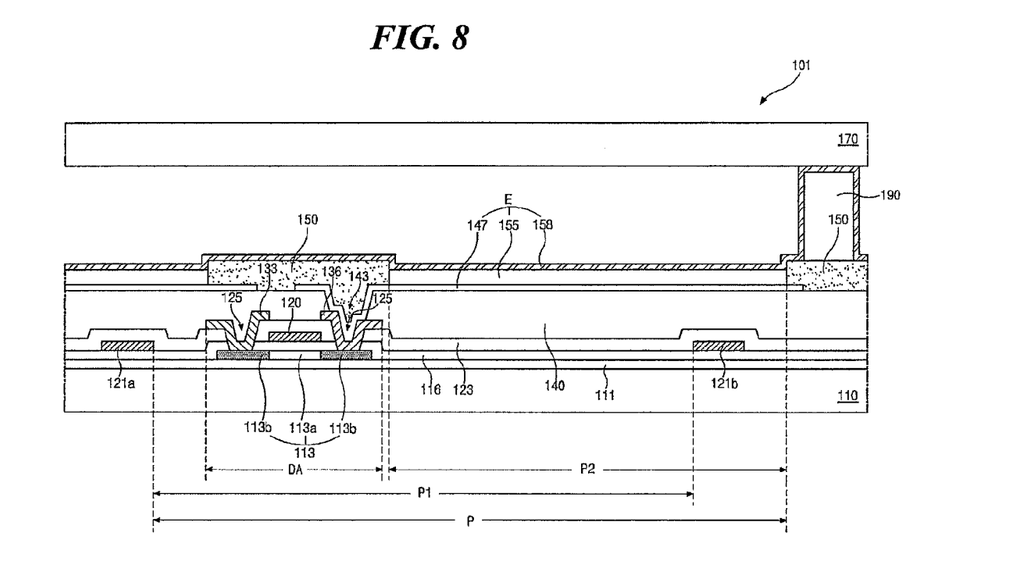
FIG. 8 is a cross-sectional view taken along the line V-V of FIG. 4 showing a spacer, which may be further formed to maintain a gap between the first and second substrates.

Referring to FIG. 8, a cross-sectional structure of the OELD device is explained. In FIG. 8, a buffer layer 111 may be formed between the first substrate 110 and the semiconductor layer 113. For example, the buffer layer 111 may be formed of an inorganic insulating material such as silicon oxide and silicon nitride. An alkali ion is diffused from the first substrate into the semiconductor layer during a crystallization process for the semiconductor layer such that properties of the semiconductor layer are deteriorated. The buffer layer 111 is required to prevent these problems. The buffer layer 111 may be omitted depending on properties of the first substrate.

A gate insulating layer 116 is formed on the semiconductor layer 113, and a gate electrode 120 is formed on the gate insulating layer 116 in the driving region DA and the switching region. Namely, the gate electrode 120 corresponds to the first portion 113a of the semiconductor layer 113. In addition, the first and second gate lines 121a and 121b are formed on the gate insulating layer 116. The first and second gate lines 121a and 121b are positioned at boundaries of the first pixel region P1. The gate electrode 120 of the switching region in the first pixel region P1 is connected to the first gate line 121a.

An interlayer insulating layer 123 of an inorganic insulating material is formed on the gate electrode 120 and the first and second gate lines 121a and 121b. A semiconductor contact holes 125 exposing the second portions 113b of the semiconductor layer 113 is formed through the interlayer insulating layer 123 and the gate insulating layer 116.

The first and second data lines 130a and 130b are formed on the interlayer insulating layer 123. The first and second gate lines 130a and 130b are positioned at boundaries of the first pixel region P1 and cross the first and second gate lines 121a and 121b. As a result, the first pixel region P1 is surrounded by the first and second gate lines 121a and 121b and the first and second data lines 130a and 130b. The power line 131 is formed on the interlayer insulating layer 123 to be parallel to the first and second data lines 130a and 130b. Alternatively, the power line 131 may be formed on the gate insulating layer 116 to be parallel to the first and second gate lines 121a and 121b. In addition, a source electrode 133 and a drain electrode 136 are formed on the interlayer insulating layer 123 and in the switching region and the driving region DA. The source and drain electrodes 133 and 136 respectively contact the second portions 113b of the semiconductor layer 113 through the semiconductor contact hole 125. The source electrode in the switching region is connected to the first data line 121a. The source and drain electrodes 133 and 136, the semiconductor layer 113, the gate insulating layer 116, the interlayer insulating layer 123 and the gate electrode 120 constitute the driving TFT DTr. Although not shown, the switching TFT has substantially the same structure as the driving TFT DTr. There may be one to twelve driving TFTs DTr in each pixel first region P1.

Each of the switching TFT and the driving TFT DTr is classified into a p-type and an n-type depending on a doped impurity on the second portion 113b. When a group III element, for example, boron, is doped, the TFT is classified into the p-type. When a group V element, for example, phosphorus, is doped, the TFT is classified into the n-type. The p-type TFT uses a hole as a carrier, while the n-type TFT uses an electron as a carrier. An electrode, which is connected to the drain electrode of the driving TFT, serves as an anode for the p-type TFT and as a cathode for the n-type TFT. In the present invention, the driving TFT DTr has the p-type such that the first electrode 147 serves as the anode. Alternatively, the driving TFT DTr may have the n-type such that the first electrode 147 serves as the cathode. When each of the switching TFT and the driving TFT DTr has the n-type, each of the switching TFT and the driving TFT DTr may have a bottom gate type. Namely, each of the switching TFT and the driving TFT DTr includes a gate electrode on a substrate, a gate insulating layer on the gate electrode, a semiconductor layer on the gate insulating layer, an ohmic contact layer on the semiconductor layer and source and drain electrodes on the ohmic contact layer.

A passivation layer 140 is formed on the switching TFT and the driving TFT DTr and includes a drain contact hole 143 exposing the drain electrode 136 of the driving TFT DTr. The passivation layer 140 has a flat top surface.

The first electrode 147 is formed on the passivation layer 140 and of a transparent conductive material having a relatively high work function. The transparent conductive material includes indium-tin-oxide (ITO) and indium-zinc-oxide (IZO). The first electrode 147 contacts and is electrically connected to the drain electrode 136 of the driving TFT DTr through the drain contact hole 143. The first electrode 147 covers a portion of the first pixel region P1 and an entire surface of the second pixel region P2. Although not shown, a reflective sheet may be further formed between the passivation layer 140 and the first electrode 147 to improve an optical efficiency. The reflective sheet is formed of a material having an excellent reflective property. Alternatively, the first electrode 147 may have a double-layered structure of a reflective material layer and a transparent conductive material layer. If the first electrode serves as a cathode, the first electrode may be formed of an opaque material having a relatively low work function. For example, the opaque material may be includes aluminum (Al), Al alloy, silver (Ag), magnesium (Mg) and gold (Au).

The bank 150 is formed on the first electrode 147 at boundaries of the second pixel region P2. Namely, the second pixel region P2 is surrounded by the bank 150, and the bank 150 overlaps edges of the first electrode 147. In addition, the bank 147 covers a portion of the first electrode 147, so as to correspond to the drain contact hole 143 in the first pixel region P1. The bank 150 has an opening corresponding to the second pixel region P2.

The organic emitting layer 155 is formed on the first electrode 147 and in the second pixel region P2. The organic emitting layer 155 of one second pixel region P1 among three adjacent second pixel regions emits one of red, green and blue colors, the organic emitting layer 155 of another second pixel region P1 among three adjacent second pixel regions emits another of red, green and blue colors, and the organic emitting layer 155 of the other second pixel region P1 among three adjacent second pixel regions emits the other of red, green and blue colors. FIG. 5 shows the organic emitting layer 155 of a single layer. However, the organic emitting layer 155 may have a multi-layered structure to improve an emitting efficiency. For example, the organic emitting layer 155 may includes a hole injection layer, a hole transporting layer, an emitting material layer, an electron transporting layer and an electron injection layer. A relative position of the hole injection layer and hole transporting layer, and the electron transporting layer and an electron injection layer depends on a function of each of the first electrode 147 and the second electrode 158. In the present invention, since the first electrode 147 serves as the anode, the hole injection layer, the hole transporting layer, the emitting material layer, the electron transporting layer and the electron injection layer are sequentially stacked on the first electrode 147.

The second electrode 158 serving as the cathode is formed on the organic emitting layer 155 and the bank 150 to cover an entire surface of a display region of the first substrate 110. The second electrode 158 is formed of a material having a relatively low work function, for example, Al, Al alloy, Ag, Mg or Au. The work function of the second electrode 158 is smaller than that of the first electrode 147. Since the OELD 101 is a top emission type, the second electrode 158 has an enough small thickness such that light from the organic emitting layer 155 passes through the second electrode 158. If the second electrode serves as the anode, the second electrode is formed of a transparent conductive material having a relatively high work function, for example, ITO or IZO. The first and second electrodes 147 and 158 and the organic emitting layer 155 therebetween constitute an organic electroluminescent diode E.

The second substrate 170 having a transparent property faces the first substrate 110. A seal pattern (not shown) is formed along edges of the first and second substrates 110 and 170 to seal a space between the first ands second substrates 110 and 170. A moisture absorption member (not shown) is formed in the seal pattern to prevent for moisture from penetrating into the space between the first and second substrates 110 and 170. Alternatively, instead of the seal pattern, a frit pattern and an adhesive film may be used to seal the space between the first and second substrates 110 and 170. In addition, instead of the second substrate 170, an organic film having a multiple-layered structure may be formed on the second electrode to encapsulate the first substrate 110.

Referring to FIG. 8, a spacer 190, which corresponds to the bank 150 and is disposed under the second electrode 158, may be further formed to maintain a gap between the first and second substrates 110 and 170. When the organic emitting layer 155 is formed by a thermal deposition using a shadow mask, the spacer 190 may support the shadow mask.

A fabricating process of the OELD device according to the present invention will be explained with FIGS. 4 and 5.

An intrinsic amorphous silicon layer (not shown) is formed on the first substrate 110. The intrinsic amorphous silicon layer is crystallized by a laser beam or a heat to form a polycrystalline silicon layer. The polycrystalline silicon layer is patterned using a mask process to form the semiconductor layer 113 in the switching region and the driving region DA. The mask process includes a step of forming a photoresist (PR) layer, a step of exposing the PR layer using a mask, a step of developing the exposed PR layer to form a PR pattern, a step of etching a material layer using the PR pattern as an etching mask, and a step of stripping the PR pattern. Before forming the intrinsic amorphous silicon layer, the buffer layer 111 (of FIG. 8) may be formed on the first substrate 110 by depositing an inorganic insulating material such as silicon oxide and silicon nitride.

Next, the gate insulating layer 116 is formed on the semiconductor layer 113 by depositing an inorganic insulating material such as silicon oxide and silicon nitride.

Next, a first metal layer (not shown) is formed on the gate insulating layer 116 by depositing a first metallic material such as Al, Al alloy, copper (Cu), Cu alloy and chromium (Cr). The first metal layer is patterned using a mask process to form the gate electrode 120 and the first and second gate lines 121a and 121b. The gate electrode 120 corresponds to a center portion of the semiconductor layer 113.

Next, a group III element, for example, boron, is doped onto the semiconductor layer 113 using the gate electrode 120 as a doping mask such that the second portion 113b, where the group III element is doped, is obtained. The center portion of the gate electrode 120 is defined as the first portion 113a serving as a channel.

Next, the interlayer insulating layer 123 is formed on the gate electrode 120 and the first and second gate lines 121a and 121b by depositing an inorganic insulating material such as silicon oxide and silicon nitride. The interlayer insulating layer 123 and the gate insulating layer 116 are patterned to form the semiconductor contact hole 125 exposing the second portions 113b of the semiconductor layer 113.

Next, a second metal layer (not shown) is formed on the interlayer insulating layer 123 by depositing a second metallic material such as Al, Al alloy, Cu, Cu alloy, Cr and molybdenum (Mo). The second metal layer is patterned using a mask process to form the first and second data lines 130a and 130b, the power line 131 and the source and drain electrodes 133 and 136. The first and second data lines 130a and 130b cross the first and second gate lines 121a and 121b such that the first pixel region P1 is surrounded by the first and second data lines 130a and 130b and the first and second gate lines 121a and 121b. The source and drain electrodes 133 and 136, the semiconductor layer 113, the gate insulating layer 116, the interlayer insulating layer 123 and the gate electrode 120 constitute the driving TFT DTr. Although not shown, the switching TFT has substantially the same structure as the driving TFT DTr.

Next, the passivation layer 140 having a flat top surface is formed on the driving TFT DTr and the switching TFT by coating an organic insulating material such as photo-acryl and benzocyclobutene (BCB). The passivation layer 140 is patterned to form the drain contact hole 143 exposing the drain electrode 136 of the driving TFT DTr. If there are several driving TFTs, the drain contact hole 143 exposes the drain electrode of only one driving TFT.

Next, the first electrode 147 is formed on the passivation layer 140 by depositing and pattering a transparent conductive material such as ITO and IZO. The first electrode 147 contacts the drain electrode 136 of the driving TFT DTr through the drain contact hole 143. When the first electrode 147 has a double-layered structure to improve an optical efficiency, a lower layer is formed of one of Al and Al alloy, which has an excellent reflective property, and an upper layer is formed of the transparent conductive material. Alternatively, if the first electrode serves as a cathode, the first electrode is formed of a material having a relatively low work function, for example, Al, Al alloy, Ag, Mg or Au.

Next, the bank 150 is formed on the second electrode 147 by coating and pattering an organic insulating material, for example, photo-acryl or BCB, or depositing and patterning an inorganic insulating material, for example, silicon oxide or silicon nitride. The bank 150 is positioned at boundaries of the second pixel region P2 such that the second pixel region P2 is surrounded by the bank 150. In addition, the bank 150 covers a portion of the first electrode 147, so as to correspond to the drain contact hole 143 in the first pixel region P1.

Next, a shadow mask (not shown) is disposed over the first substrate 110. The shadow mask has an opening, which corresponds to the second pixel region P2, and a shielding portion corresponding to other portions. Then, an organic emitting material is thermal deposited onto the first electrode 147 using the shadow mask to form the organic emitting layer 155. FIG. 5 shows the organic emitting layer 155 of a single layer. However, the organic emitting layer 155 may have a multi-layered structure to improve an emitting efficiency. For example, the organic emitting layer 155 may includes a hole injection layer, a hole transporting layer, an emitting material layer, an electron transporting layer and an electron injection layer. A thermal depositing process of the organic emitting material is repeated to form red, green and blue organic emitting patterns of the organic emitting layer 155.

Before forming the organic emitting layer 155, a spacer 190 (of FIG. 8) having a column shape and a height of about 3 to 4 micrometers may be formed on the bank 150. The shadow mask for forming the organic emitting layer 155 is supported by the spacer 190.

Next, the second electrode 158 is formed on the organic emitting layer 155 and the bank 150 by depositing a metallic material having a relative low work function, such as Al, Al alloy, Ag, Mg and Au, without a mask process. The second electrode 158 has a thickness of about 5 to 50 angstroms such that light emitted from the organic emitting layer 155 passes through the second electrode 158. If the second electrode serves as an anode, the second electrode is formed of a transparent conductive material such as ITO and IZO.

The second substrate 170 having a transparent property faces the first substrate 110. The seal pattern (not shown) or the frit pattern is formed along edges of the first and second substrates 110 and 170 to seal a space between the first ands second substrates 110 and 170. A moisture absorption member (not shown) including barium oxide or calcium oxide is formed in the seal pattern to prevent for moisture from penetrating into the space between the first and second substrates 110 and 170. Alternatively, instead of the seal pattern and the frit pattern, the adhesive film may be used to seal the space between the first and second substrates 110 and 170. Entire surfaces of the first and second substrates 110 and 170 are attached to each other by the adhesive film.

Next, the first and second substrates 110 and 170 are attached by the seal pattern or the fit pattern under a condition of an inert gas or a vacuum. If the first and second substrates 110 and 170 are attached by the adhesive film, the attaching process is processed under an atmospheric condition. Alternatively, instead of the second substrate 170, an organic film having a multiple-layered structure may be formed on the second electrode to encapsulate the first substrate 110.

In the present invention, since an emitting area, where the organic emitting layer is formed, has substantially the same size as the pixel region, which is surrounded by the gate and data lines, an aperture ratio is maximized. In addition, the OELD device has improved luminance.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display (OELD) device, comprising:
   a first substrate having a first unit pixel region including a first pixel region and a second pixel region;
   first and second gate lines along a first direction and on the first substrate;
   first and second data lines along a second direction, which is perpendicular to the first direction, and crossing the first and second gate lines to define the first pixel region;
   a power line parallel to one of the first and second directions;
   a switching thin film transistor (TFT) in the first pixel region and connected to the first gate line and the first data line;
   a driving TFT in the first pixel region and connected to the switching TFT and the power line;

a passivation layer on the switching and driving TFTs and including a first contact hole exposing a portion of the driving TFT;
a first electrode in a portion of the first pixel region and an entire surface of the second pixel region, and contacting the driving TFT through the first contact hole;
a bank surrounding the second pixel region and corresponding the first contact hole;
an organic emitting layer in the second pixel region and on the first electrode; and
a transparent second electrode on the organic emitting layer and the bank,
wherein the second pixel region is a region shifted from the first pixel region such that the second gate line goes across the second pixel region, and the first substrate further has a second unit pixel region disposed at an upper side direction of the first unit pixel region, a third unit pixel region at a horizontal side of the first unit pixel region and a fourth unit pixel region at a diagonal side of the first unit pixel region, and
wherein the second pixel region of the first unit pixel region overlaps portions of the second, third, and fourth unit pixel regions.

2. The device according to claim 1, wherein the organic emitting layer covers the entire surface of the second pixel region.

3. The device according to claim 1, wherein the organic emitting layer overlaps the second gate line.

4. The device according to claim 3, wherein the organic emitting layer further overlaps the second data line and the power line.

5. The device according to claim 1, wherein each of the first and second pixel regions has a rectangular shape.

6. The device according to claim 1, wherein the first pixel region has a rectangular shape, and the second pixel region has a polygonal shape having at least five angles.

7. The device according to claim 6, wherein the second pixel region has a honey comb shape.

8. The device according to claim 1, wherein organic emitting layer includes a hole injection layer, a hole transporting layer, an emitting material layer, an electron transporting layer and an electron injection layer.

9. The device according to claim 1, further comprising a spacer having a column shape between the bank and the second electrode.

10. The device according to claim 1, wherein each of the switching and driving TFTs includes a semiconductor layer, which is formed of a polycrystalline silicon and includes a first portion and second portions at both side of the first portion, on the first substrate, a gate insulating layer on the semiconductor layer, a gate electrode on the gate insulating layer and corresponding to the first portion of the semiconductor layer, an interlayer insulating layer on the gate electrode, a source electrode on the interlayer insulating layer and contacting one of the second portion of the semiconductor layer through a second contact hole through the interlayer insulating layer and the gate insulating layer, and a drain electrode on the interlayer insulating layer and contacting the other of the second portion of the semiconductor layer through a third contact hole through the interlayer insulating layer and the gate insulating layer.

11. The device according to claim 10, further comprising a buffer layer between the first substrate and the semiconductor layer being formed of silicon oxide or silicon nitride.

12. The device according to claim 1, further comprising a second substrate facing the first substrate.

13. A method of fabricating an OELD device, comprising:
forming first and second gate lines along a first direction and on a first substrate having a unit pixel region, the unit pixel region including a first pixel region and a second pixel region;
forming first and second data lines along a second direction, which is perpendicular to the first direction, and crossing the first and second gate lines to define the first pixel region;
forming a power line;
forming a switching thin film transistor (TFT) in the first pixel region and connected to the first gate line and the first data line;
forming a driving TFT in the first pixel region and connected to the switching TFT and the power line;
forming a passivation layer on the switching and driving TFTs and including a first contact hole exposing a portion of the driving TFT;
forming a first electrode in a portion of the first pixel region and an entire surface of the second pixel region, and contacting the driving TFT through the first contact hole;
forming a bank surrounding the second pixel region and corresponding the first contact hole;
forming an organic emitting layer in the second pixel region and on the first electrode; and
forming a transparent second electrode on the organic emitting layer and the bank,
wherein the second pixel region is a region shifted from the first pixel region such that the second gate line goes across the second pixel region, and the first substrate further has a second unit pixel region disposed at an upper side of the first unit pixel region, a third unit pixel region at a horizontal side of the first unit pixel region and a fourth unit pixel region at a diagonal side of the first unit pixel region, and
wherein the second pixel region of the first unit pixel region overlaps portions of the second, third, and fourth unit pixel regions.

* * * * *